US009583580B2

(12) United States Patent
Tanaka et al.

(10) Patent No.: US 9,583,580 B2
(45) Date of Patent: Feb. 28, 2017

(54) MANUFACTURING METHOD OF THE SEMICONDUCTOR DEVICE ELECTRODE HAVING THREE METAL LAYERS

(71) Applicant: TOYODA GOSEI CO., LTD., Kiyosu-shi (JP)

(72) Inventors: Nariaki Tanaka, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/853,850

(22) Filed: Sep. 14, 2015

(65) Prior Publication Data

US 2016/0087051 A1    Mar. 24, 2016

(30) Foreign Application Priority Data

Sep. 24, 2014 (JP) ................. 2014-193473

(51) Int. Cl.
| | |
|---|---|
| *H01L 21/283* | (2006.01) |
| *H01L 29/417* | (2006.01) |
| *H01L 29/45* | (2006.01) |
| *H01L 29/20* | (2006.01) |
| *H01L 21/285* | (2006.01) |

(52) U.S. Cl.
CPC .. *H01L 29/41725* (2013.01); *H01L 21/28575* (2013.01); *H01L 29/2003* (2013.01); *H01L 29/452* (2013.01)

(58) Field of Classification Search
CPC . H01L 21/28; H01L 21/283; H01L 29/41725; H01L 29/45
See application file for complete search history.

(56) References Cited

U.S. PATENT DOCUMENTS

| | | | |
|---|---|---|---|
| 5,563,422 A | 10/1996 | Nakamura et al. | |
| 2011/0248238 A1 | 10/2011 | Yoon et al. | |

FOREIGN PATENT DOCUMENTS

| | | |
|---|---|---|
| JP | H07-45867 A | 2/1995 |
| JP | 2007-221051 A | 8/2007 |
| JP | 2010-212406 A | 9/2010 |
| JP | 5230772 B2 | 7/2013 |

*Primary Examiner* — Thanh V Pham
(74) *Attorney, Agent, or Firm* — McGinn IP Law Group, PLLC

(57) ABSTRACT

A manufacturing method of a semiconductor device, includes: a stacking process of forming an electrode by stacking a plurality of electrode layers on a semiconductor layer; and a anneal treatment process of treating the electrode. The stacking process including processes of forming a first electrode layer mainly made of aluminum (Al) as one of the plurality of electrode layers; forming a second electrode layer mainly made of a conductive material that has a higher melting point than that of aluminum (Al) and reacts with aluminum (Al) at 450° C. or higher temperature, as one of the plurality of electrode layers, on the first electrode layer; and forming a third electrode layer mainly made of palladium (Pd) as an electrode layer most distant from the semiconductor layer among the plurality of electrode layers, on the second electrode layer.

11 Claims, 16 Drawing Sheets

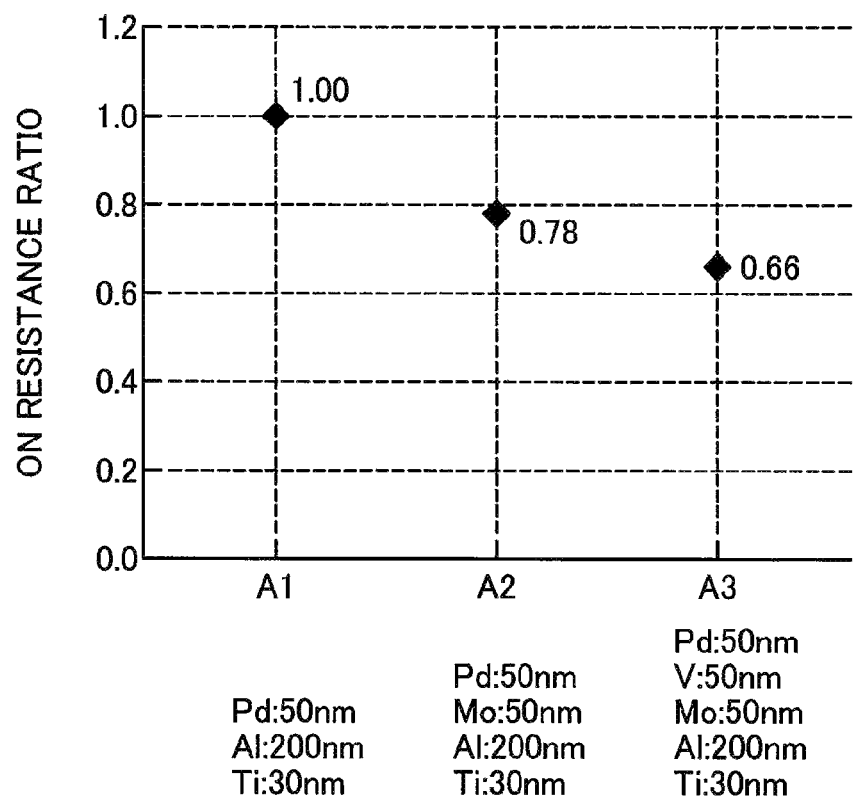

Fig.13

| Sample | B1 | B2 | B3 | B4 | B5 | B6 | B7 | B8 | B9 | B10 |
|---|---|---|---|---|---|---|---|---|---|---|
| Electrode Layer L4 (Thickness B) | Pd 50nm | Pd 80nm | Pd 50nm | Pd 20nm | Pd 20nm | Pd 100nm | Pd 50nm | Pd 50nm | Pd 50nm | Pd 50nm |
| Electrode Layer L3 (Thickness A) | — | Mo 20nm | Mo 50nm | Mo 80nm | Mo 20nm | Mo 100nm | V 50nm | Ti 50nm | Mo 50nm / V 50nm | V 50nm / Mo 50nm |
| Electrode Layer L2 (Thickness) | Al 200nm | ↓ | ↓ | ↓ | ↓ | ↓ | ↓ | ↓ | ↓ | ↓ |
| Electrode Layer L1 | Ti 30nm | ↓ | ↓ | ↓ | ↓ | ↓ | ↓ | ↓ | ↓ | ↓ |
| A/B | 0.0 | 0.25 | 1.0 | 4.0 | 1.0 | 1.0 | 1.0 | 1.0 | 2.0 | 2.0 |
| Increase Rate of Contact Resistance | 38.4 | 5.0 | 1.0 | 1.9 | 2.0 | 3.3 | 1.0 | 1.3 | 3.0 | 1.1 |
| Contact Resistance after Dry Etching [Ωcm²] ◎: ≤4.0×10⁻⁶ | $7.9 \times 10^{-5}$ | $1.1 \times 10^{-4}$ | $5.9 \times 10^{-6}$ | $2.9 \times 10^{-6}$ ◎ | $9.7 \times 10^{-6}$ | $1.5 \times 10^{-5}$ | $2.4 \times 10^{-6}$ ◎ | $4.9 \times 10^{-6}$ | $3.7 \times 10^{-6}$ ◎ | $2.1 \times 10^{-6}$ ◎ |

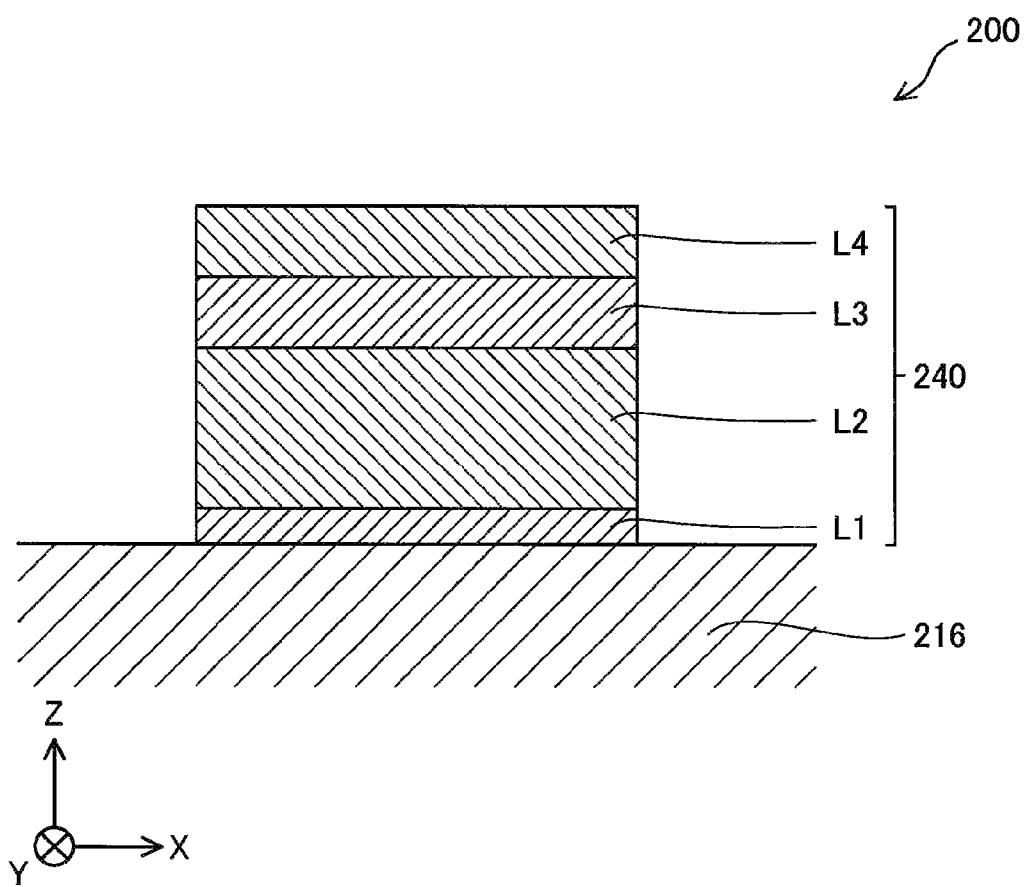

MANUFACTURING METHOD OF THE SEMICONDUCTOR DEVICE ELECTRODE HAVING THREE METAL LAYERS

CROSS-REFERENCE TO RELATED APPLICATION

The present application claims priority from Japanese patent application P2014-193473 filed on Sep. 14, 2014, the entirety of disclosures of which is hereby incorporated by reference into this application.

BACKGROUND

1. Technical Field

The present invention relates to a semiconductor device and a manufacturing method of the same.

2. Related Art

In known techniques of manufacturing a semiconductor device, there is a technique for forming an electrode having ohmic characteristics (ohmic electrode) on a semiconductor layer (for example, JP H07-45867A and JP 2010-212406A). In general, the ohmic electrode formed on the semiconductor layer is required to reduce the contact resistance while ensuring the adhesion to the semiconductor layer.

JP H07-45867A describes formation of an electrode having stacked structure of titanium (Ti) and aluminum (Al), in order to ensure the ohmic characteristics of the electrode. JP 2010-212406A describes formation of an electrode having stacked structure of three metal layers, in order to improve the resistance of the electrode to acid corrosion and alkali corrosion.

SUMMARY

The proposed electrodes of JP H07-45867A and JP 2010-212406A, however, have a problem of insufficient resistance to dry etching and a resulting increase in contact resistance by dry etching. Accordingly, there is a need for an ohmic electrode having sufficient resistance to dry etching. With regard to the semiconductor device, other needs includes cost reduction, miniaturization, easy manufacture, resource saving, improved usability and improved durability.

In order to solve at least part of the problems described above, the invention may be implemented by the following aspects.

(1) According to one aspect of the invention, a manufacturing method of a semiconductor device is provided. The manufacturing method may comprise a stacking process of forming an electrode by stacking a plurality of electrode layers on a semiconductor layer; and a anneal treatment process of treating the electrode. The stacking process may comprise processes of; forming a first electrode layer mainly made of aluminum (Al) as one of the plurality of electrode layers; forming a second electrode layer mainly made of a conductive material that has a higher melting point than that of aluminum (Al) and reacts with aluminum (Al) at 450° C. or higher temperature, as one of the plurality of electrode layers, on the first electrode layer; and forming a third electrode layer mainly made of palladium (Pd) as an electrode layer most distant from the semiconductor layer among the plurality of electrode layers, on the second electrode layer. The manufacturing method of this aspect allows for formation of the electrode that suppresses an increase in contact resistance by dry etching. As a result, this improves the flexibility in the manufacturing process of the semiconductor device.

(2) In the manufacturing method of the above aspect, a thickness of the second electrode layer may be not less than 10 nm. This aspect allows for formation of the electrode that more effectively suppresses an increase in contact resistance by dry etching.

(3) In the manufacturing method of the above aspect, the process of forming the second electrode layer may form at least one electrode layer selected from the group consisting of an electrode layer mainly made of molybdenum (Mo), an electrode layer mainly made of vanadium (V), an electrode layer mainly made of titanium (Ti), an electrode layer mainly made of tantalum (Ta), an electrode layer mainly made of tungsten (W), an electrode layer mainly made of niobium (Nb), an electrode layer mainly made of platinum (Pt), an electrode layer mainly made of zirconium (Zr) and an electrode layer mainly made of hafnium (Hf), as the second electrode layer. This aspect facilitates formation of the electrode that suppresses an increase in contact resistance by dry etching.

(4) In the manufacturing method of the above aspect, a thickness of the third electrode layer may be not less than 10 nm. This aspect allows for formation of the electrode that more effectively suppresses an increase in contact resistance by dry etching.

(5) In the manufacturing method of the above aspect, a ratio A/B of thickness A of the second electrode layer to thickness B of the third electrode layer may be between 0.25 and 4.0, inclusive. This aspect allows for formation of the electrode that more effectively suppresses an increase in contact resistance by dry etching.

(6) In the manufacturing method of the above aspect, a ratio A/B of thickness A of the second electrode layer to thickness B of the third electrode layer may be between 0.33 and 3.3, inclusive. This aspect allows for formation of the electrode that more effectively suppresses an increase in contact resistance by dry etching.

(7) In the manufacturing method of the above aspect, the stacking process may form the electrode to surfaces spreading from the semiconductor layer to another electrode formed on the semiconductor layer. This aspect protects the another electrode from dry etching.

(8) In the manufacturing method of the above aspect, the stacking process may form the electrode on the semiconductor layer mainly made of gallium nitride (GaN). This aspect allows for formation of an electrode that suppresses an increase in contact resistance by dry etching in a GaN-based semiconductor device.

(9) In the manufacturing method of the above aspect, the stacking process may further comprise a process of forming another electrode layer mainly made of at least one of titanium (Ti) and vanadium (V) as one of the plurality of electrode layers on the semiconductor layer, and the process of forming the first electrode layer may form the first electrode layer on the another electrode layer. This aspect allows for formation of an electrode that sufficiently suppresses the contact resistance with the semiconductor layer.

(10) In the manufacturing method of the above aspect, the anneal treatment process may treat the electrode for a time period between 1 minute and 10 minutes, inclusive. This aspect allows for formation of an electrode that has sufficient ohmic characteristics.

(11) In the manufacturing method of the above aspect, the anneal treatment process may treat the electrode at a treatment temperature between 450° C. and 700° C., inclusive. This aspect allows for formation of an electrode that has sufficient ohmic characteristics.

The invention may be implemented by various aspects other than the manufacturing method of the semiconductor device, for example, a semiconductor device manufactured by the manufacturing method of any of the above aspects, an electrical appliance with the semiconductor device incorporated therein and a manufacturing apparatus for manufacturing the semiconductor device.

The above aspects of the invention allow for formation of an electrode that suppresses an increase in contact resistance by dry etching. As a result, this improves the flexibility in the manufacturing process of the semiconductor device.

BRIEF DESCRIPTION OF DRAWINGS

The invention will be described with reference to the accompanying drawings in which:

FIG. 12 is a graph showing results of evaluation for the on resistance in a first evaluation test;

FIG. 13 is a table showing the results of evaluation with regard to electrodes in a second evaluation test;

FIG. 14 is a sectional diagram schematically illustrating the structure of a semiconductor device as samples used in the second evaluation test;

DESCRIPTION OF EMBODIMENTS

A. First Embodiment

A-1. Structure of Semiconductor Device

Figure 1:
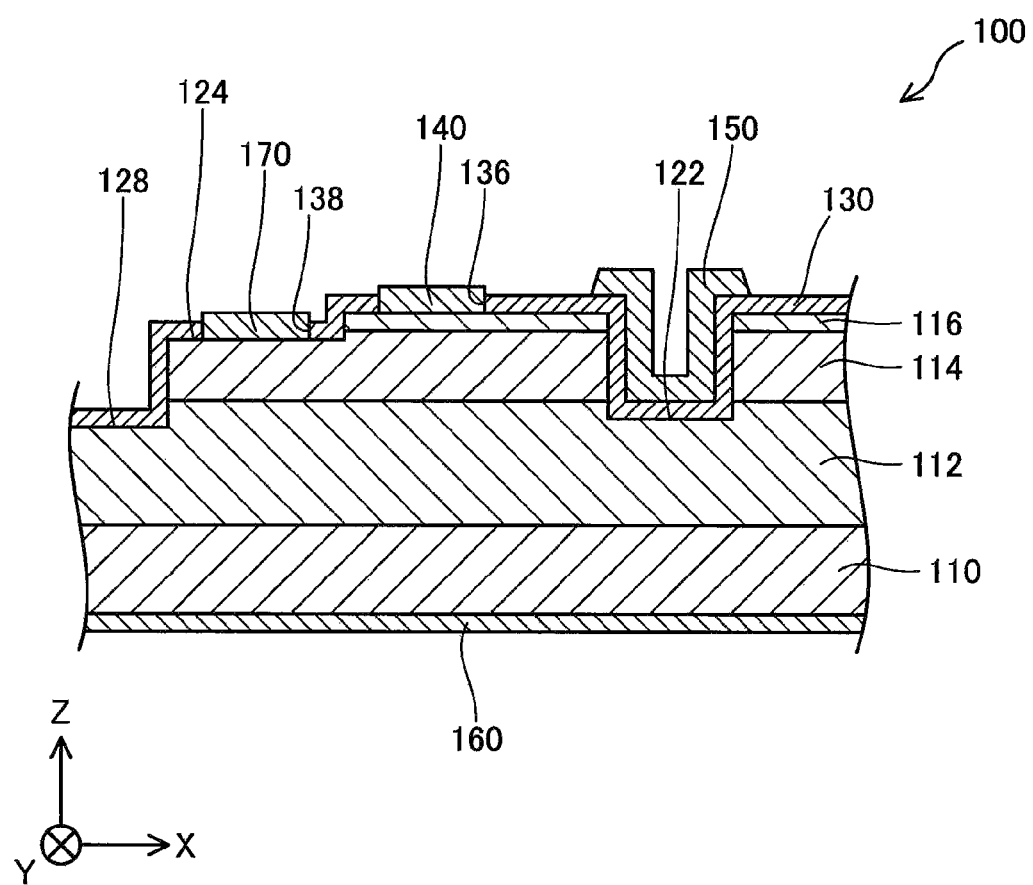
FIG. 1 is a sectional view schematically illustrating the structure of a semiconductor device according to a first embodiment.

FIG. 1 is a sectional view schematically illustrating the structure of a semiconductor device 100 according to a first embodiment. The semiconductor device 100 is a GaN-based semiconductor device formed by using gallium nitride (GaN). According to this embodiment, the semiconductor device 100 is a vertical trench MOSFET (metal oxide semiconductor field effect transistor). According to this embodiment, the semiconductor device 100 is used for power control and is also called power device.

XYZ axes orthogonal to one another are illustrated in FIG. 1. Among the XYZ axes in FIG. 1, the X axis is an axis going from the left side of the sheet surface to the right side of the sheet surface of FIG. 1; +X-axis direction is a direction going rightward on the sheet surface and −X-axis direction is a direction going leftward on the sheet surface. Among the XYZ axes in FIG. 1, the Y axis is an axis going from the front side of the sheet surface to the rear side of the sheet surface of FIG. 1; +Y-axis direction is a direction going backward on the sheet surface and −Y-axis direction is a direction going forward on the sheet surface. Among the XYZ axes in FIG. 1, the Z axis is an axis going from the lower side of the sheet surface to the upper side of the sheet surface of FIG. 1; +Z-axis direction is a direction going upward on the sheet surface and −Z-axis direction is a direction going downward on the sheet surface.

The semiconductor device 100 includes a substrate 110, a semiconductor layer 112, a semiconductor layer 114 and a semiconductor layer 116. The semiconductor device 100 has a trench 122, a recess 124 and a trench 128 as structures formed in these semiconductor layers 112, 114 and 116. The semiconductor device 100 further includes an insulating film 130, a source electrode 140, a gate electrode 150, a drain electrode 160 and a body electrode 170.

The substrate 110 of the semiconductor device 100 is a semiconductor formed in a plate-like shape extended along both the X axis and the Y axis. According to this embodiment, the substrate 110 is mainly made of gallium nitride (GaN). In the description of this specification, the wording "mainly made of gallium nitride (GaN)" means containing gallium nitride (GaN) at a molar fraction of not lower than 90%. According to this embodiment, the substrate 110 is an n-type semiconductor containing silicon (Si) as the donor element. According to this embodiment, the average concentration of silicon (Si) included in the substrate 110 is about $1 \times 10^{18}$ cm$^{-3}$.

The semiconductor layer 112 of the semiconductor device 100 is a semiconductor layer located on the +Z-axis direction side of the substrate 110 and extended along the X axis and the Y axis. According to this embodiment, the semiconductor layer 112 is mainly made of gallium nitride (GaN). According to this embodiment, the semiconductor layer 112 is an n-type semiconductor containing silicon (Si) as the donor element. According to this embodiment, the average concentration of silicon (Si) included in the semiconductor layer 112 is about $1 \times 10^{16}$ cm$^{-3}$. According to this embodiment, the semiconductor layer 112 has thickness (length in the Z-axis direction) of about 10 μm (micrometers).

The semiconductor layer 114 of the semiconductor device 100 is a semiconductor layer located on the +Z-axis direction side of the semiconductor layer 112 and extended along the X axis and the Y axis. According to this embodiment, the semiconductor layer 114 is mainly made of gallium nitride (GaN). According to this embodiment, the semiconductor layer 114 is a p-type semiconductor containing magnesium (Mg) as the acceptor element. According to this embodiment, the average concentration of magnesium (Mg) included in the semiconductor layer 114 is about $4 \times 10^{18}$ cm$^{-3}$. According to this embodiment, the semiconductor layer 114 has thickness (length in the Z-axis direction) of about 1.0 μm.

The semiconductor layer 116 of the semiconductor device 100 is a semiconductor layer located on the +Z-axis direction side of the semiconductor layer 114 and extended along the X axis and the Y axis. According to this embodiment, the semiconductor layer 116 is mainly made of gallium nitride (GaN). According to this embodiment, the semiconductor layer 116 is an n-type semiconductor containing silicon (Si) as the donor element. According to this embodiment, the average concentration of silicon (Si) included in the semiconductor layer 116 is about 3×10$^{18}$ cm$^{-3}$. According to this embodiment, the semiconductor layer 116 has thickness (length in the Z-axis direction) of about 0.2 μm.

The trench 122 of the semiconductor device 100 is a groove formed in the semiconductor layers 112, 114 and 116 to be recessed in the thickness direction (−Z axis direction) of the semiconductor layers 112, 114 and 116. The trench 122 is formed from the +Z-axis direction side of the semiconductor layer 116 to pass through the semiconductor layer 114 and reach the semiconductor layer 112. According to this embodiment, the trench 122 is a structure formed by dry etching of the semiconductor layers 112, 114 and 116.

The recess 124 of the semiconductor device 100 is a concave recessed from the +Z-axis direction side of the semiconductor layer 116 to the semiconductor layer 114. According to this embodiment, the recess 124 is a structure formed by dry etching of the semiconductor layers 114 and 116.

The trench 128 of the semiconductor device 100 is a groove formed in the semiconductor layers 112, 114 and 116 at a position away from the trench 122 to be recessed in the thickness direction (−Z axis direction) of the semiconductor layers 112, 114 and 116. The trench 128 is formed from the +Z-axis direction side of the semiconductor layer 116 to pass through the semiconductor layer 114 and reach the semiconductor layer 112. The trench 128 accordingly separates the semiconductor device 100 from another device formed on the substrate 110. According to this embodiment, the trench 128 is a structure formed by dry etching of the semiconductor layers 112, 114 and 116.

The insulating film 130 of the semiconductor device 100 is a film having electrical insulating characteristics. The insulating film 130 is formed from inside to outside of the trench 122. According to this embodiment, the insulating film 130 is formed along +Z-axis direction side interfaces of the semiconductor layer 114 and of the semiconductor layer 116, and from inside to outside of the trench 128, in addition to from inside to outside of the trench 122. According to this embodiment, the insulating film 130 is mainly made of silicon dioxide (SiO$_2$). According to this embodiment, the insulating film 130 is a film formed by atomic layer deposition (ALD).

The insulating film 130 has a contact hole 136 and a contact hole 138. The contact hole 136 is an opening area formed to pass through the insulating film 130 and reach the semiconductor layer 116. The contact hole 138 is an opening area formed to pass through the insulating film 130 and reach the semiconductor layer 114. According to this embodiment, the contact holes 136 and 138 are structures formed by wet etching of the insulating film 130.

The source electrode 140 of the semiconductor device 100 is an electrode formed in the contact hole 136. The source electrode 140 is in ohmic contact with the semiconductor layer 116 that is the n-type semiconductor.

Figure 2:
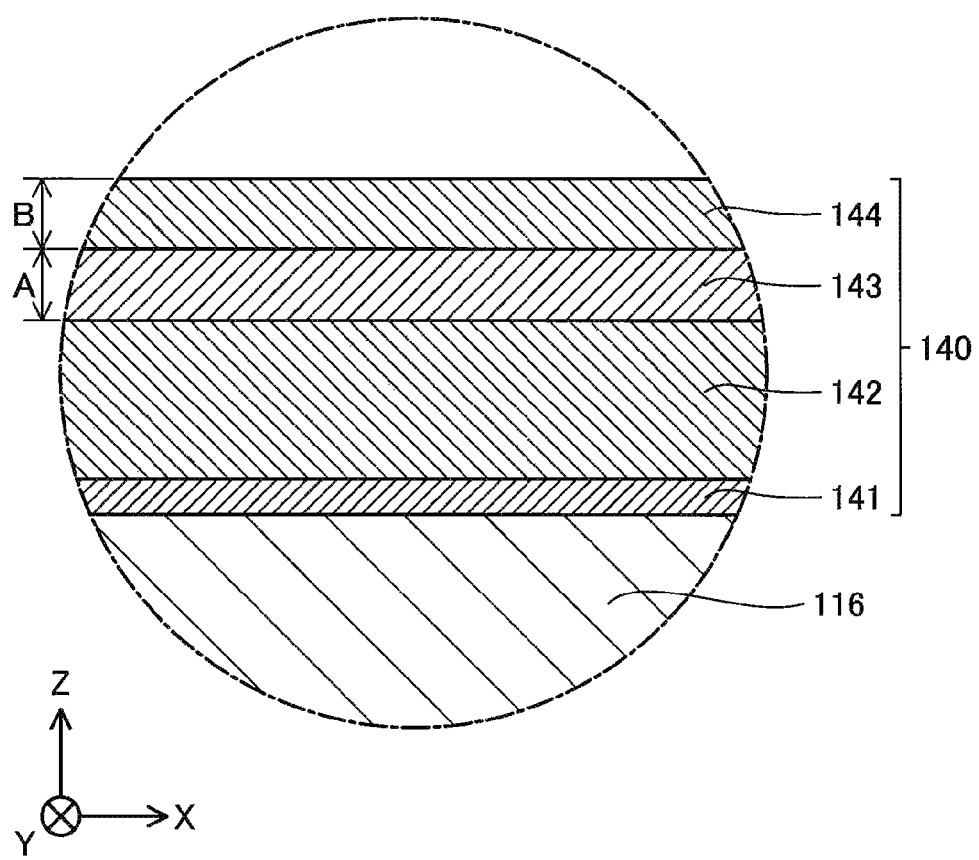
FIG. 2 is a diagram illustrating the detailed structure of a source electrode.

FIG. 2 is a diagram illustrating the detailed structure of the source electrode 140. The source electrode 140 is an electrode formed by stacking a plurality of electrode layers and treating the stacked electrode layers by annealing process. According to this embodiment, the source electrode 140 has four electrode layers 141, 142, 143 and 144 as the plurality of electrode layers. According to this embodiment, each electrode layer of the source electrode 140 is a metal layer formed by vapor deposition.

The electrode layer 141 of the source electrode 140 is another electrode layer formed on the semiconductor layer 116. According to this embodiment, the electrode layer 141 is mainly made of titanium (Ti). The electrode layer 141 may have thickness (length in the Z-axis direction) between 5 nm (nanometers) and 50 nm, inclusive. In terms of reducing the contact resistance of the source electrode 140, the thickness of the electrode layer 141 is preferably not less than 5 nm. In terms of reducing the manufacturing cost, the thickness of the electrode layer 141 is preferably not greater than 50 nm. According to this embodiment, the thickness of the electrode layer 141 is about 30 nm.

The electrode layer 142 of the source electrode 140 is a first electrode layer mainly made of aluminum (Al). According to this embodiment, the electrode layer 142 is formed on the electrode layer 141. The electrode layer 142 may have thickness (length in the Z-axis direction) between 100 nm and 1000 nm, inclusive. In terms of reducing the contact resistance of the source electrode 140, the thickness of the electrode layer 142 is preferably not less than 100 nm. In terms of reducing the manufacturing cost, the thickness of the electrode layer 142 is preferably not greater than 1000 nm. According to this embodiment, the thickness of the electrode layer 142 is about 200 nm.

The electrode layer 143 of the source electrode 140 is a second electrode layer placed between the electrode layer 142 and the electrode layer 144. According to this embodiment, the electrode layer 143 is mainly made of molybdenum (Mo). Molybdenum (Mo) is a conductive material that has a higher melting point than that of aluminum (Al) and reacts with aluminum (Al) at 450° C. or higher temperature. The material of the electrode layer 143 is preferably a material that does not react with aluminum (Al) at temperature of anneal treatment of the source electrode 140 but reacts with aluminum (Al) at higher temperature than the temperature of anneal treatment of the source electrode 140. The electrode layer 143 may have thickness A (length in the Z-axis direction) between 10 nm and 1000 nm, inclusive. In terms of suppressing an increase in contact resistance by dry etching, the thickness A of the electrode layer 143 is preferably not less than 10 nm, is more preferably not less than 20 nm and is furthermore preferably not less than 50 nm. In terms of reducing the manufacturing cost, the thickness A of the electrode layer 143 is preferably not greater than 1000 nm. According to this embodiment, the thickness A of the electrode layer 143 is about 50 nm.

The electrode layer 144 of the source electrode 140 is a third electrode layer formed on the electrode layer 144 and mainly made of palladium (Pd). The electrode layer 144 forms an outermost layer that is most distant from the semiconductor layer 116, among the plurality of electrode layers of the source electrode 140. The electrode layer 144 is exposed to outside of the semiconductor device 100. The electrode layer 144 may have thickness B (length in the Z-axis direction) between 10 nm and 1000 nm, inclusive. In terms of suppressing an increase in contact resistance by dry etching, the thickness B of the electrode layer 144 is preferably not less than 10 nm. In terms of reducing the manufacturing cost, the thickness B of the electrode layer 144 is preferably not greater than 1000 nm. According to this embodiment, the thickness B of the electrode layer 144 is about 50 nm. In terms of suppressing an increase in contact resistance by dry etching, a ratio A/B of the thickness A of the electrode layer 143 to the thickness B of the electrode layer 144 is preferably between 0.25 and 4.0, inclusive and is more preferably between 0.33 and 3.3, inclusive. According to this embodiment, the ratio A/B is 1.0.

In FIG. 1, the gate electrode 150 of the semiconductor device 100 is an electrode formed in the trench 122 via the insulating film 130. According to this embodiment, the gate electrode 150 is mainly made of aluminum (Al). When a voltage is applied to the gate electrode 150, an inversion layer is formed in the semiconductor layer 114 and serves as a channel, so as to form a conductive path between the source electrode 140 and the drain electrode 160.

The drain electrode 160 of the semiconductor device 100 is an electrode formed on a −Z-axis direction side of the substrate 110. The drain electrode 160 is in ohmic contact with the substrate 110. According to this embodiment, the drain electrode 160 is an electrode formed by stacking a layer made of aluminum (Al) on a layer made of titanium (Ti) and treating the stacked layers by annealing process.

The body electrode 170 of the semiconductor device 100 is an electrode formed in the contact hole 138. The body electrode 170 is in ohmic contact with the semiconductor layer 114. According to this embodiment, the body electrode 170 is an electrode formed by stacking a layer made of palladium (Pd) on the semiconductor layer 114 and treating the palladium layer by annealing process.

A-2. Manufacturing Method of Semiconductor Device

Figure 3:
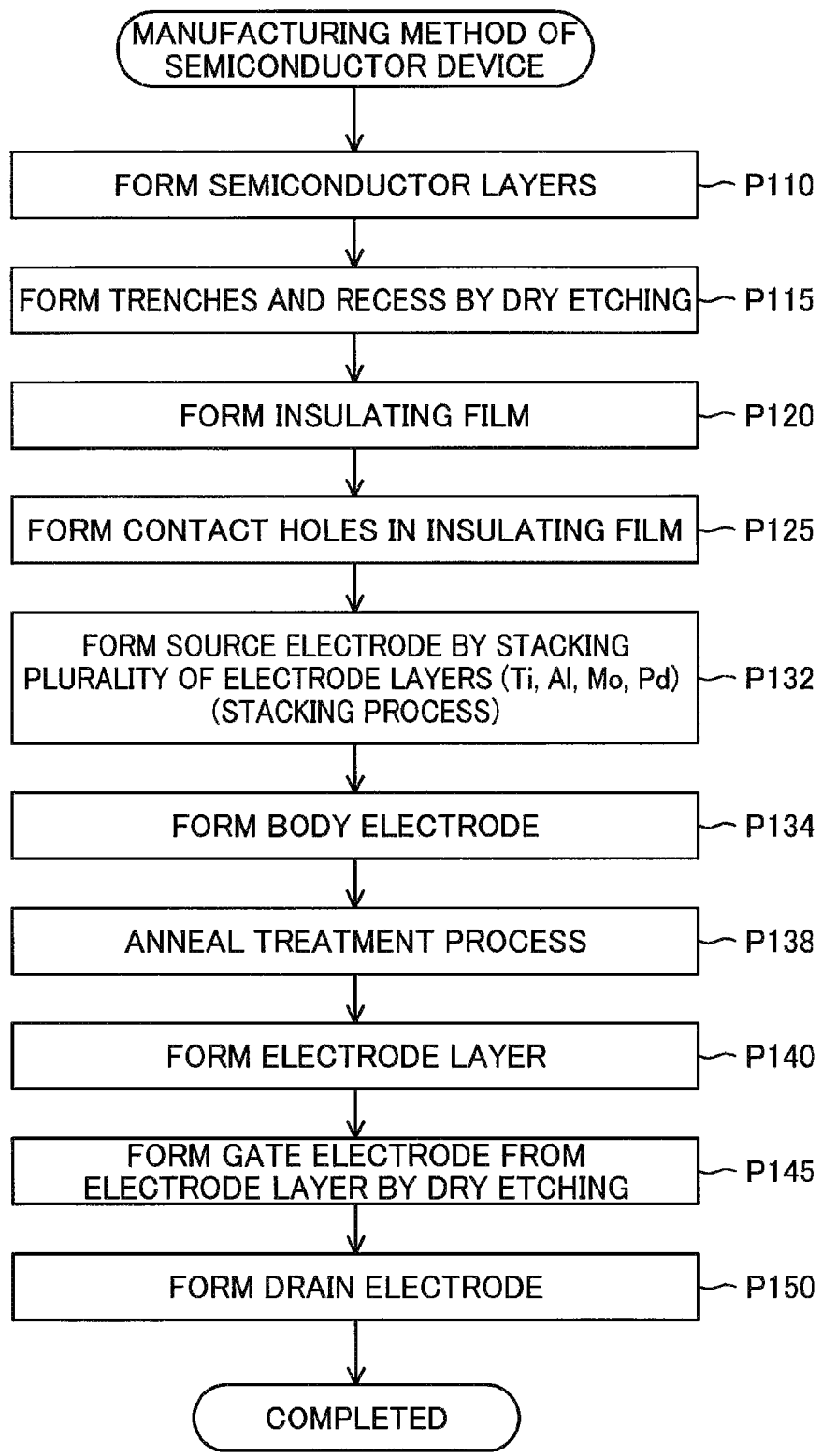
FIG. 3 is a flowchart showing a manufacturing method of the semiconductor device according to the first embodiment.

FIG. 3 is a flowchart showing a manufacturing method of the semiconductor device 100 according to the first embodiment. The manufacturer first forms the semiconductor layers 112, 114 and 116 on the substrate 110 by crystal growth (process P110). According to this embodiment, the manufacturer employs metal organic chemical vapor deposition (MOCVD) to form the semiconductor layers 112, 114 and 116.

Figure 4:
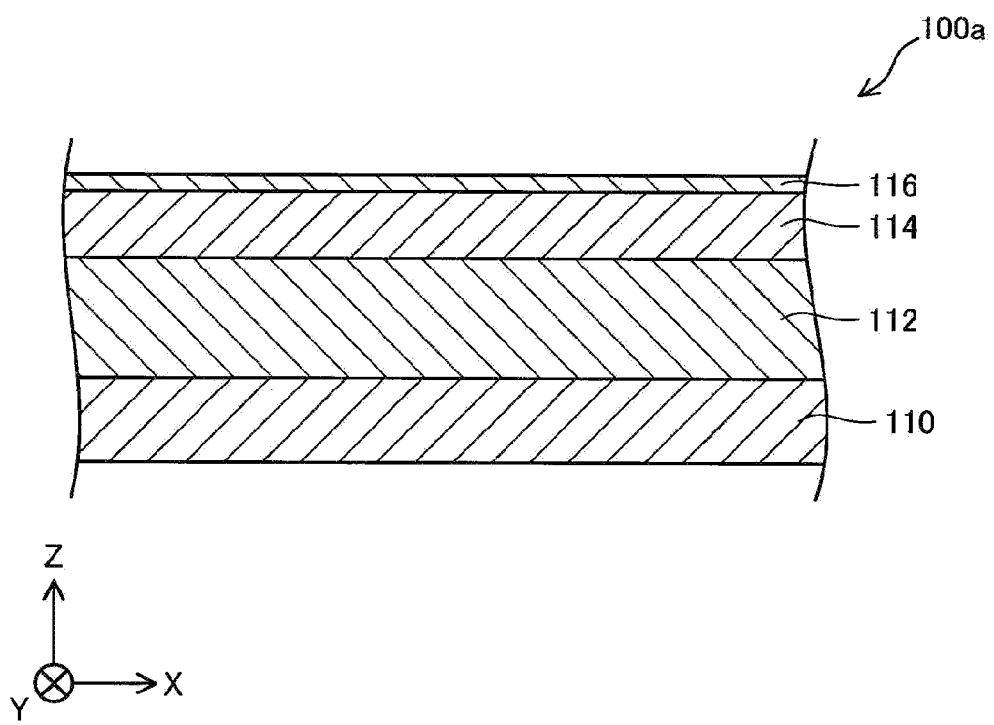
FIG. 4 is a sectional view schematically illustrating the structure of a semiconductor device in the course of manufacture.

FIG. 4 is a sectional view schematically illustrating the structure of a semiconductor device 100a in the course of manufacture. According to this embodiment, the manufacturer forms the semiconductor layers 112, 114 and 116 on the substrate 110 by MOCVD. The manufacturer accordingly obtains the semiconductor device 100a in which the semiconductor layers 112, 114 and 116 are sequentially formed on the substrate 110.

Referring back to FIG. 3, after forming the semiconductor layers 112, 114 and 116 (process P110), the manufacturer forms the trenches 122 and 128 and the recess 124 by dry etching (process P115). According to this embodiment, the manufacturer forms the trenches 122 and 128 and the recess 124 by dry etching using a chlorine-based gas.

Figure 5:
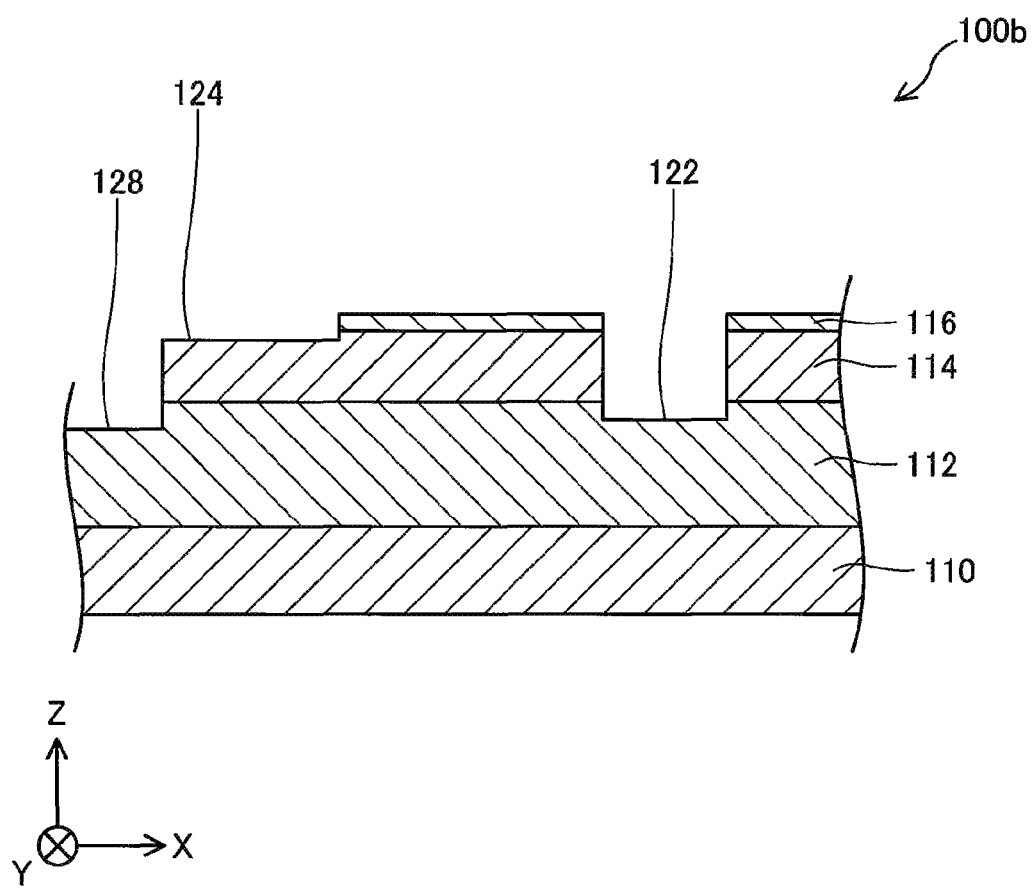
FIG. 5 is a sectional view schematically illustrating the structure of a semiconductor device in the course of manufacture.

FIG. 5 is a sectional view schematically illustrating the structure of a semiconductor device 100b in the course of manufacture. According to this embodiment, the manufacturer forms the trenches 122 and 128 and the recess 124 in the semiconductor layers 112, 114 and 116 of the semiconductor device 100a by dry etching. The manufacturer accordingly obtains the semiconductor device 100b in which the trenches 122 and 128 and the recess 124 are formed.

Referring back to FIG. 3, after forming the trenches 122 and 128 and the recess 124 (process P115), the manufacturer forms the insulating film 130 (process P120). According to this embodiment, the manufacturer employs atomic layer deposition (ALD) to form the insulating film 130 that is mainly made of silicon dioxide ($SiO_2$).

Figure 6:
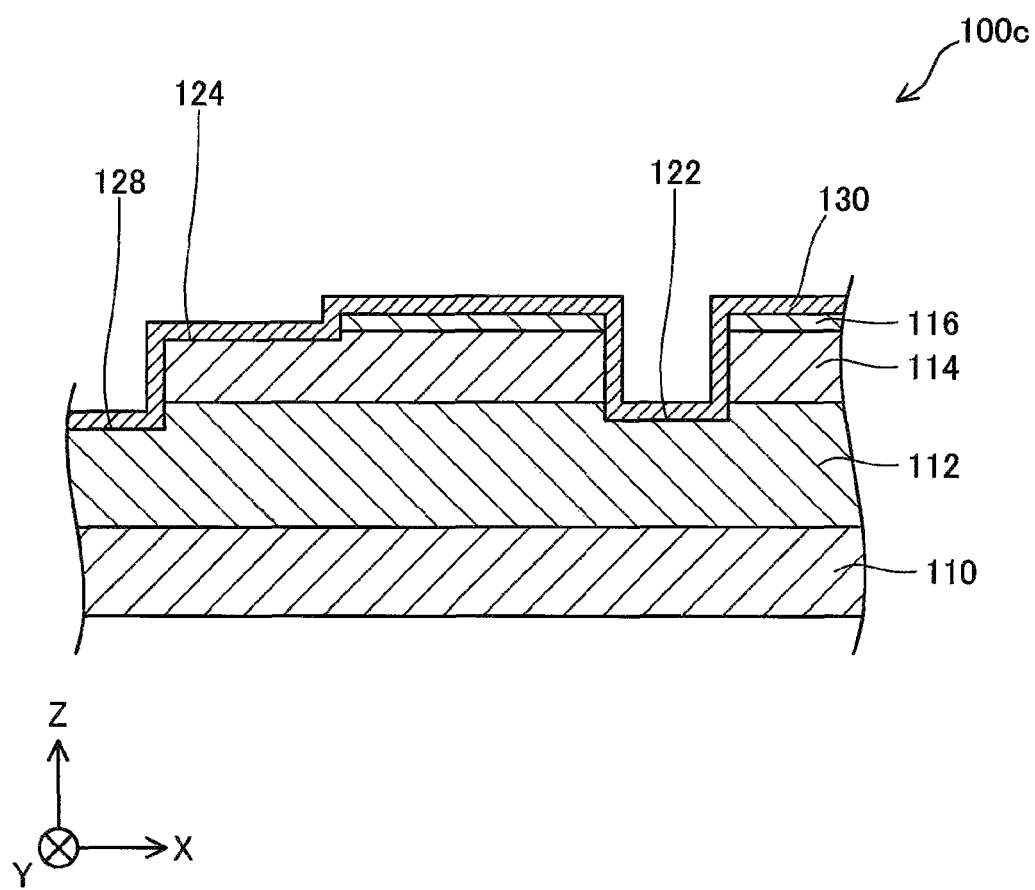
FIG. 6 is a sectional view schematically illustrating the structure of a semiconductor device in the course of manufacture.

FIG. 6 is a sectional view schematically illustrating the structure of a semiconductor device 100c in the course of manufacture. According to this embodiment, the manufacturer forms the insulating film 130 over the entire surfaces exposed on the +Z-axis direction side of the semiconductor layers 112, 114 and 116 of the semiconductor device 100b. The manufacturer accordingly obtains the semiconductor device 100c, in which the insulating film 130 is formed over the trenches 122 and 128 and the recess 124.

Referring back to FIG. 3, after forming the insulating film 130 (process P120), the manufacturer forms the contact holes 136 and 138 in the insulating film 130 by wet etching (process P125).

Figure 7:
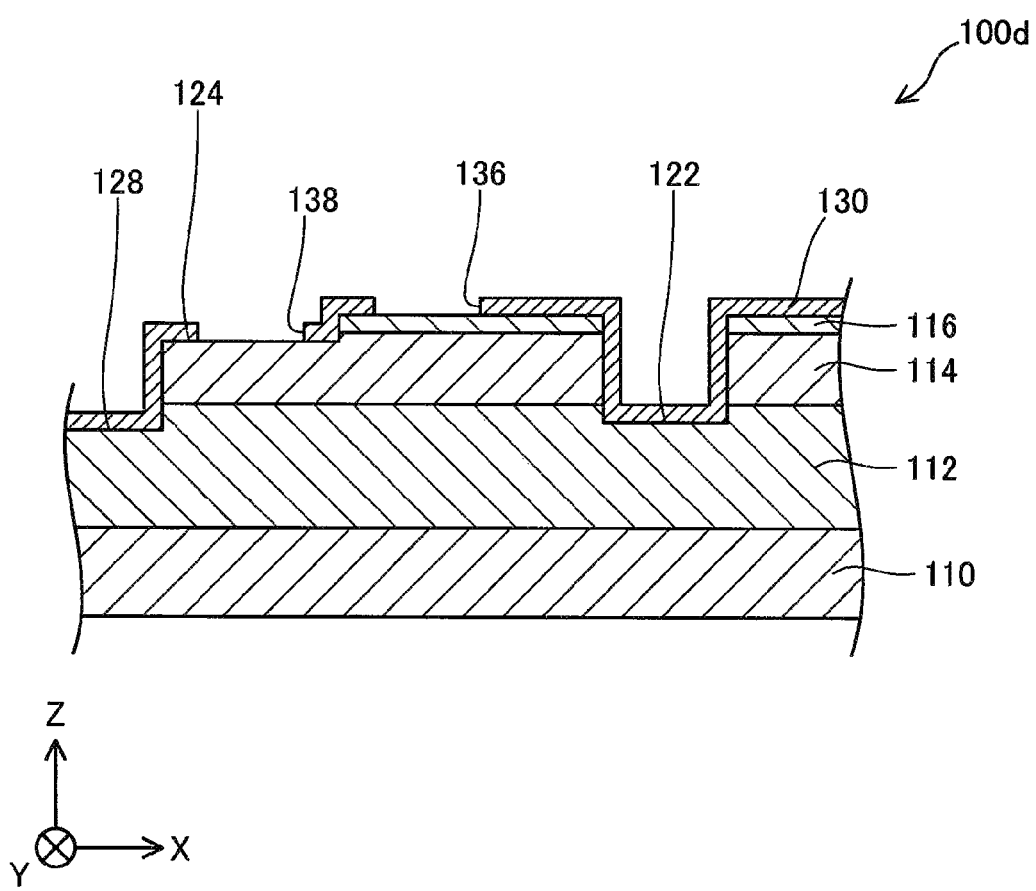
FIG. 7 is a sectional view schematically illustrating the structure of a semiconductor device in the course of manufacture.

FIG. 7 is a sectional view schematically illustrating the structure of a semiconductor device 100d in the course of manufacture. According to this embodiment, the manufacturer forms the contact holes 136 and 138 in the insulating film 130 of the semiconductor device 100c by wet etching. The manufacturer accordingly obtains the semiconductor device 100d, in which the contact holes 136 and 138 are formed.

Referring back to FIG. 3, after forming the contact holes 136 and 138 (process P125), the manufacturer performs a stacking process to stack a plurality of electrode layers on the semiconductor layer 116 and thereby forms the source electrode 140 (process P132). According to this embodiment, the manufacturer stacks the plurality of electrode layers 141, 142, 143 and 144 on the semiconductor layer 116 that is exposed on the contact hole 136 (as shown in FIG. 2). According to this embodiment, the manufacturer applies self-alignment and utilizes a resist mask which is used for formation of the contact hole 136, to form the source electrode 140.

In the stacking process, the manufacturer forms the electrode layer 141 mainly made of titanium (Ti) on the semiconductor layer 116 by vapor deposition. The thickness of the electrode layer 141 may be between 5 nm and 50 nm, inclusive. According to this embodiment, the manufacturer forms the electrode layer 141 in the thickness of about 30 nm.

After forming the electrode layer 141, the manufacturer forms the electrode layer 142 mainly made of aluminum (Al) on the electrode layer 141 by vapor deposition. The thickness of the electrode layer 142 may be between 100 nm and 1000 nm, inclusive. According to this embodiment, the manufacturer forms the electrode layer 142 in the thickness of about 200 nm.

After forming the electrode layer 142, the manufacturer forms the electrode layer 143 mainly made of molybdenum (Mo) on the electrode layer 142 by vapor deposition. The thickness of the electrode layer 143 may be between 10 nm and 1000 nm, inclusive. According to this embodiment, the manufacturer forms the electrode layer 143 in the thickness of about 50 nm.

After forming the electrode layer 143, the manufacturer forms the electrode layer 144 mainly made of palladium (Pd) on the electrode layer 143 by vapor deposition. The thickness of the electrode layer 144 may be between 10 nm and 1000 nm, inclusive. According to this embodiment, the manufacturer forms the electrode layer 144 in the thickness of about 50 nm. In terms of suppressing an increase in contact resistance by dry etching, the ratio A/B of the thickness A of the electrode layer 143 to the thickness B of the electrode layer 144 is preferably between 0.25 and 4.0, inclusive and is more preferably between 0.33 and 3.3, inclusive. According to this embodiment, the ratio A/B is 1.0.

Referring back to FIG. 3, after forming the source electrode 140 (process P132), the manufacturer forms the body electrode 170 (process P134). According to this embodiment, the manufacturer forms an electrode mainly made of palladium (Pd) as the body electrode 170 on the semiconductor layer 114 exposed on the contact hole 138. According to this embodiment, the manufacturer applies self-alignment and utilizes a resist mask which is used for formation of the contact hole 138, to form the body electrode 170. According to another embodiment, the manufacturer may form the body electrode 170, prior to formation of the source electrode 140.

After forming the source electrode 140 and the body electrode 170 (processes P132 and P134), the manufacturer performs a anneal treatment process to treat the source electrode 140 and the body electrode 170 by anneal treatment (annealing process) and thereby reduces the contact resistances of the source electrode 140 and the body electrode 170 (process P138). The anneal treatment time may be between 1 minute and 10 minutes, inclusive. The anneal treatment temperature may be between 500° C. and 700° C., inclusive. The atmosphere for anneal treatment may be nitrogen ($N_2$) or argon (Ar), may contain oxygen, or may be in vacuum. According to this embodiment, the source electrode 140 and the body electrode 170 are subjected to anneal treatment in a gas mainly made of nitrogen at the treatment temperature of 550° C. for 5 minutes. According to another embodiment, the manufacturer may separately treat the source electrode 140 and the body electrode 170 by anneal treatment.

Figure 8:
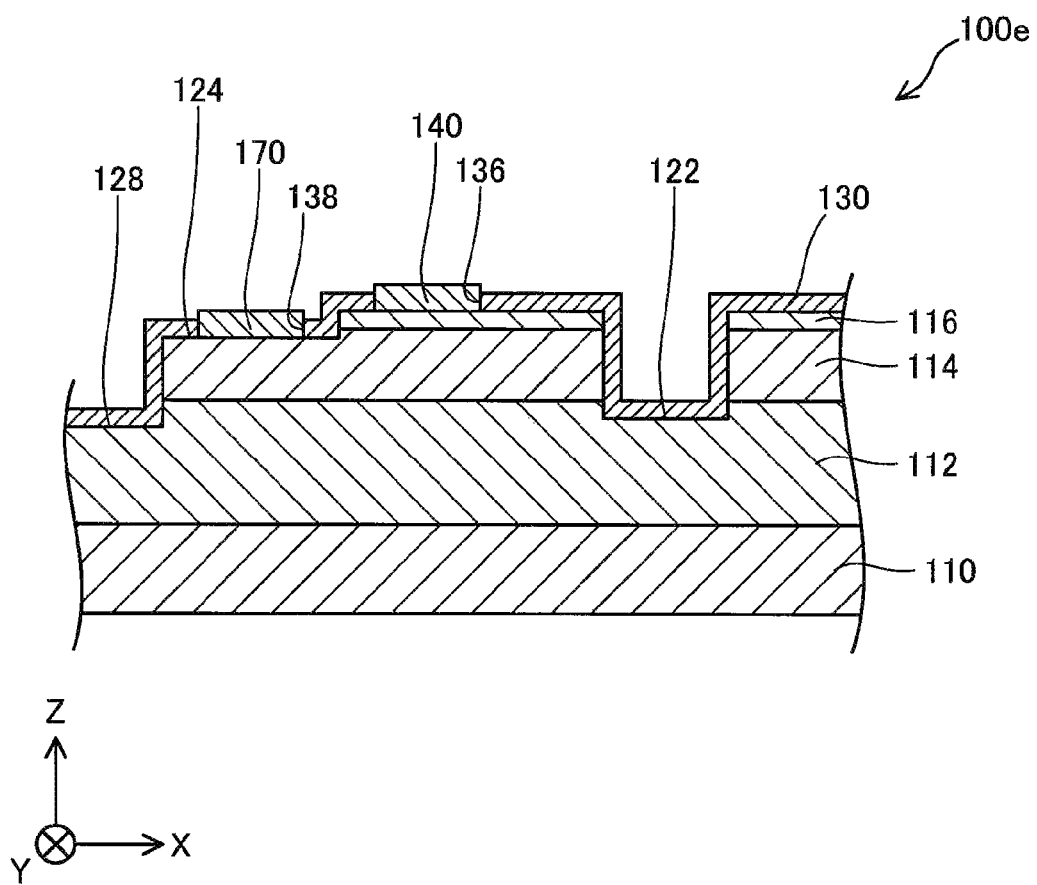
FIG. 8 is a sectional view schematically illustrating the structure of a semiconductor device in the course of manufacture.

FIG. 8 is a sectional diagram schematically illustrating the structure of a semiconductor device 100e in the course of manufacture. According to this embodiment, the manufacturer forms the source electrode 140 in the contact hole 136 of the semiconductor device 100d and forms the body electrode 170 in the contact hole 138 of the semiconductor device 100d. Subsequently the manufacturer treats the source electrode 140 and the body electrode 170 by anneal treatment. The manufacturer accordingly obtains the semiconductor device 100e in which the source electrode 140 and the body electrode 170 are formed.

Figure 9:
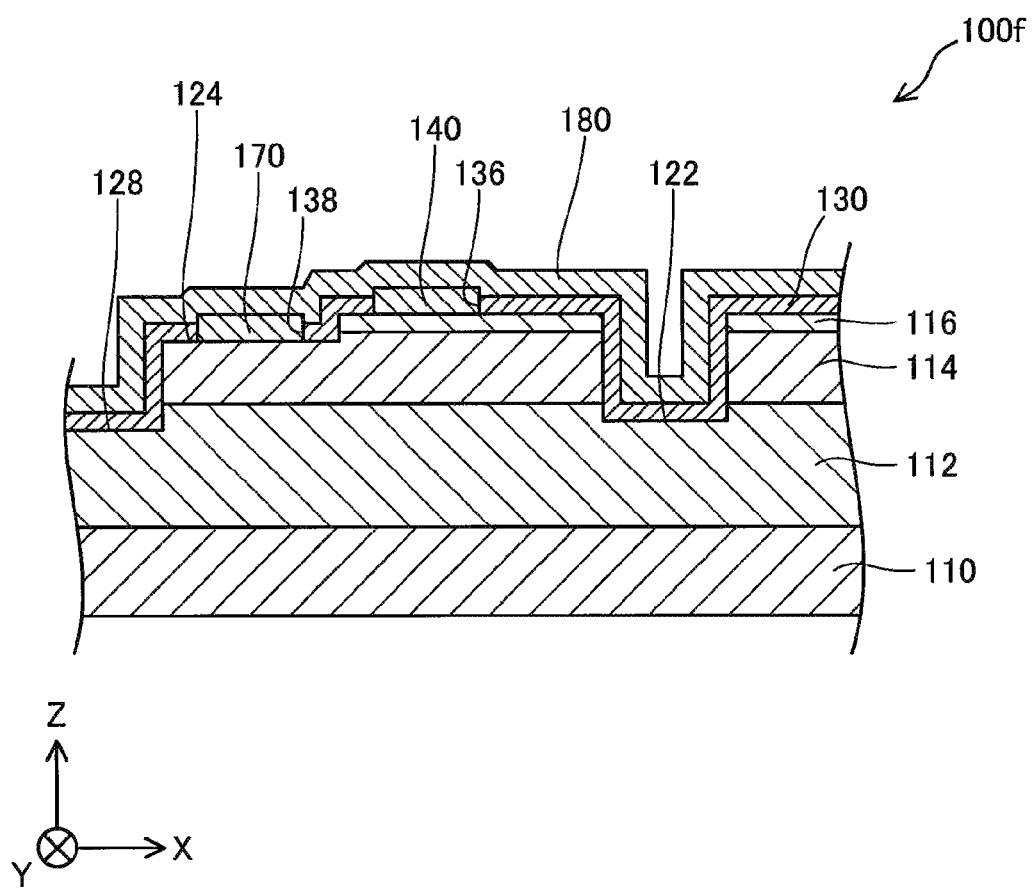
FIG. 9 is a sectional view schematically illustrating the structure of a semiconductor device in the course of manufacture.

FIG. 9 is a sectional diagram schematically illustrating the structure of a semiconductor device 100f in the course of manufacture. After performing the anneal treatment process (process P138), the manufacturer forms an electrode layer 180, which is the base of the gate electrode 150, on an exposed +Z-axis direction side surface of the semiconductor device 100e (process P140). According to this embodiment, the manufacturer forms the electrode layer 180 mainly made of aluminum (Al) by vapor deposition. According to this embodiment, the manufacturer forms the electrode layer 180 over the entire exposed +Z-axis direction side surface of the semiconductor device 100e. The manufacturer accordingly obtains the semiconductor device 100f, in which the electrode layer 180 is formed over the entire +Z-axis direction side surface.

Referring back to FIG. 3, after forming the electrode layer 180 (process P140), the manufacturer forms the gate electrode 150 from the electrode layer 180 by dry etching (process P145). According to this embodiment, the manufacturer removes part of the electrode layer 180 excluding the trench 122 and its periphery by dry etching and forms the gate electrode 150 as a remaining part of the electrode layer 180 left by dry etching. In the course of forming the gate electrode 150 by dry etching, the source electrode 140 and the body electrode 170 are also exposed to dry etching. According to this embodiment, the manufacturer uses a mixed gas mainly made of chlorine ($Cl_2$), boron chloride ($BCl_2$) and nitrogen ($N_2$) to form the gate electrode 150 by inductively coupled plasma (ICP) dry etching.

Figure 10:
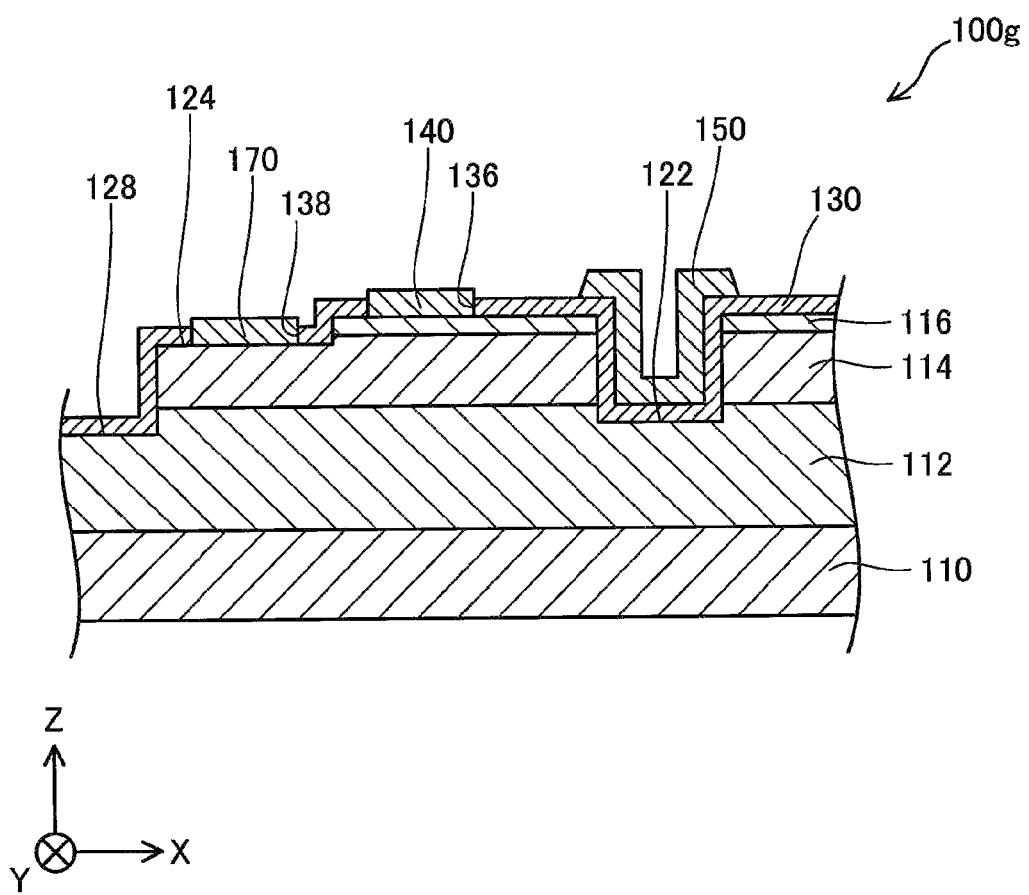
FIG. 10 is a sectional view schematically illustrating the structure of a semiconductor device in the course of manufacture.

FIG. 10 is a sectional view schematically illustrating the structure of a semiconductor device 100g in the course of manufacture. According to this embodiment, the manufacturer removes part of the electrode layer 180 of the semiconductor device 100f by dry etching to form the gate electrode 150. The manufacturer accordingly obtains the semiconductor device 100g, in which the gate electrode 150 is formed.

Referring back to FIG. 3, after forming the gate electrode 150 (process P145), the manufacturer forms the drain electrode 160 on the −Z-axis direction side of the substrate 110 (process P150). According to this embodiment, the manufacturer forms the drain electrode 160 by stacking a layer made of aluminum (Al) on a layer made of titanium (Ti) and treating the stacked layers by annealing process. The semiconductor device 100 is completed through the above series of processes.

A-3. Modifications

Figure 11:
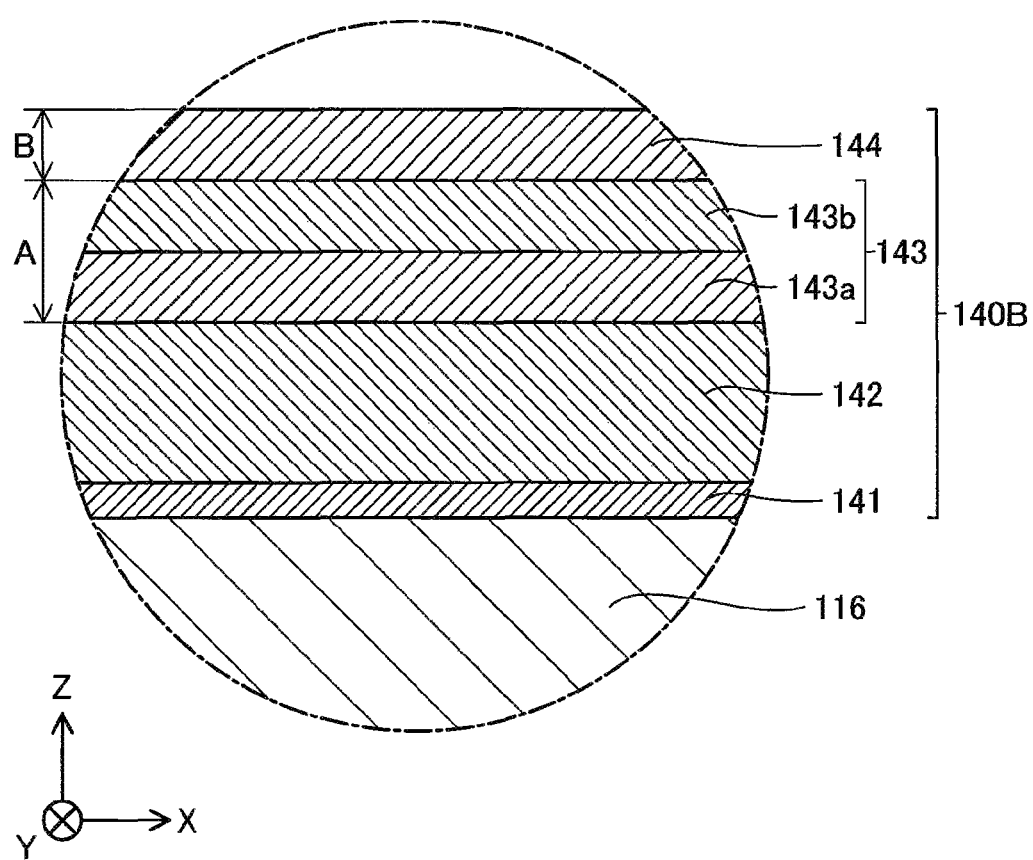
FIG. 11 is a diagram illustrating the detailed structure of a source electrode according to a modification of the first embodiment.

FIG. 11 is a diagram illustrating the detailed structure of a source electrode 140B according to a modification of the first embodiment. The source electrode 140B of the modification has the similar structure to that of the source electrode 140 shown in FIG. 2, except that two-layered electrode layers 143a and 143b are provided as the electrode layer 143 placed between the electrode layer 142 and the electrode layer 144. According to another modification, the source electrode 140B may include three-layered or more-layered electrode layers as the electrode layer 143.

The electrode layer 143a of the source electrode 140B is formed on the electrode layer 142 and is mainly made of molybdenum (Mo). The electrode layer 143b of the source electrode 140B is formed on the electrode layer 143a and is mainly made of vanadium (V). In common with molybdenum (Mo), vanadium (V) is a conductive material that has a higher melting point than that of aluminum (Al) and reacts with aluminum (Al) at 450° C. or higher temperature.

The electrode layer 143 consisting of the electrode layers 143a and 143b may have thickness A (length in the Z-axis direction) between 10 nm and 1000 nm, inclusive. In terms of suppressing an increase in contact resistance by dry etching, the thickness A of the electrode layer 143 is preferably not less than 20 nm and is more preferably not less than 50 nm. In terms of reducing the manufacturing cost, the thickness A of the electrode layer 143 is preferably not greater than 1000 nm. According to this modification, the thickness A of the electrode layer 143 is about 100 nm; the thickness of the electrode layer 143a is about 50 nm, while the thickness of the electrode layer 143b is about 50 nm. In this modification, in terms of suppressing an increase in contact resistance by dry etching, the ratio A/B of the thickness A of the electrode layer 143 to the thickness B of the electrode layer 144 is preferably between 0.25 and 4.0, inclusive and is more preferably between 0.33 and 3.3, inclusive. In this modification, the ratio A/B is 2.0.

A-4. First Evaluation Test

FIG. 12 is a graph showing results of evaluation for the on resistance in a first evaluation test. In the first evaluation test, the examiner produced samples A1, A2 and A3 as semiconductor devices having different structures of source electrodes. The sample A1 is similar to the semiconductor device 100 except the multi-layered structure of a source electrode. The sample A2 is identical with the semiconductor device 100 and includes the source electrode 140 having the multi-layered structure shown in FIG. 2. The sample A3 is similar to the semiconductor device 100 except the multi-layered structure of a source electrode and includes the source electrode 140B having the multi-layered structure shown in FIG. 11. The following shows the multi-layered structures of the source electrodes of the respective samples.

<Source Electrode of Sample A1>
sequentially from the semiconductor layer 116-side,
First layer: electrode layer mainly made of titanium (Ti) (thickness of 30 nm);
Second layer: electrode layer mainly made of aluminum (Al) (thickness of 200 nm); and
Third layer: electrode layer mainly made of palladium (Pd) (thickness of 50 nm).

<Source Electrode of Sample A2>
sequentially from the semiconductor layer 116-side,
First layer: electrode layer mainly made of titanium (Ti) (thickness of 30 nm);
Second layer: electrode layer mainly made of aluminum (Al) (thickness of 200 nm);
Third layer: electrode layer mainly made of molybdenum (Mo) (thickness of 50 nm); and
Fourth layer: electrode layer mainly made of palladium (Pd) (thickness of 50 nm).

<Source Electrode of Sample A3>
sequentially from the semiconductor layer 116-side,
First layer: electrode layer mainly made of titanium (Ti) (thickness of 30 nm);
Second layer: electrode layer mainly made of aluminum (Al) (thickness of 200 nm);
Third layer: electrode layer mainly made of molybdenum (Mo) (thickness of 50 nm);
Fourth layer: electrode layer mainly made of vanadium (V) (thickness of 50 nm); and
Fifth layer: electrode layer mainly made of palladium (Pd) (thickness of 50 nm).

The examiner measured the on resistance of each of the samples A1, A2 and A3. The examiner then calculated a ratio (on resistance ratio) of the average value of the on-resistance of each of the samples A1, A2 and A3 to the average value of the on-resistance of the sample A1 as the basis. The examiner then obtained the results of evaluation shown in FIG. 12. The on-resistance ratio of the sample A2 is smaller than the on-resistance ratio of the sample A1, and the on-resistance ratio of the sample A3 is further smaller than the on-resistance ratio of the sample A2. These results may be attributed to the fact that the electrode layers mainly made of molybdenum (Mo) and vanadium (V) are formed between the electrode layer mainly made of aluminum (Al) and the electrode layer mainly made of palladium (Pd) so as to suppress an increase in contact resistance of the source electrode by dry etching. In the samples A2 and A3, the electrode layer mainly made of molybdenum (Mo) and the electrode layer mainly made of vanadium (V) may suppress diffusion of aluminum (Al) to the periphery of the surface of the source electrode during anneal treatment of the source electrode. This may suppress the erosion of aluminum (Al) due to dry etching.

A-5. Second Evaluation Test

FIG. 13 is a table showing the results of evaluation with regard to electrodes in a second evaluation test. In the second evaluation test, the examiner produced samples B1 to B10 including electrodes having different multi-layered structures.

FIG. 14 is a sectional diagram schematically illustrating the structure of a semiconductor device 200 as the samples used in the second evaluation test. The semiconductor device 200 includes a semiconductor layer 216 and an electrode 240. The semiconductor layer 216 of the semiconductor device 200 is similar to the semiconductor layer 116 of the semiconductor device 100, except that the semiconductor layer 216 is formed on a sapphire substrate via a buffer layer and a GaN-based intrinsic semiconductor layer.

The electrode 240 of the semiconductor device 200 is formed on the semiconductor layer 216 that is an n-type semiconductor. The electrode 240 includes a plurality of electrode layers L1, L2, L3 and L4. The electrode layer L1 is formed on the semiconductor layer 216. The electrode layer L2 is formed on the electrode layer L1. The electrode layer L3 is formed on the electrode layer L2. The electrode layer L4 is formed on the electrode layer L3. In the sample B1, the electrode layer L3 is not formed, so that the electrode layer L4 is formed on the electrode layer L2. In the samples B9 and B10, the electrode layer L3 has two-layered structure. The examiner formed the respective electrode layers of the electrode 240 by vapor deposition and subsequently treated the electrode 240 of each sample by anneal treatment in a gas mainly made of nitrogen at the treatment temperature of 550° C. for 5 minutes.

Figure 15:
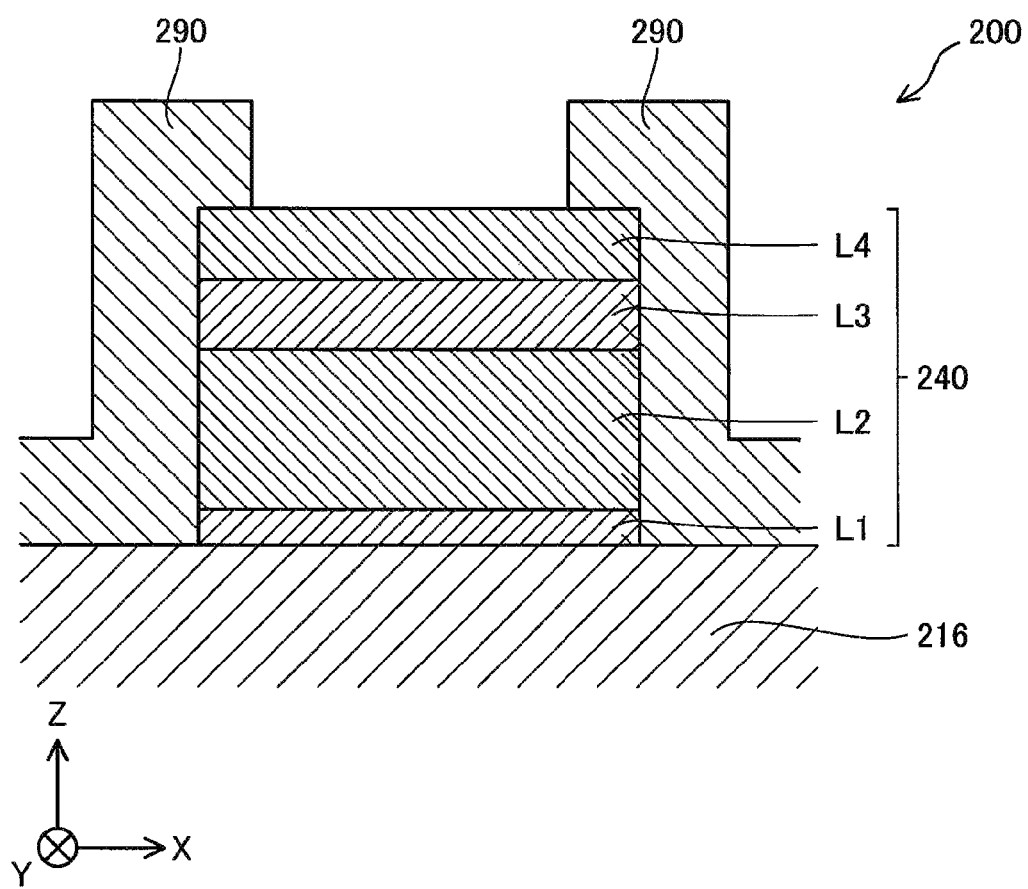
FIG. 15 is a diagram illustrating a dry etching process in the second evaluation test.

FIG. 15 is a diagram illustrating a dry etching process 240 in the second evaluation test. The examiner treated the electrode 240 of each sample by anneal treatment and subsequently formed a photoresist 290 to expose a +Z-axis direction side surface of the electrode 240. Subsequently the examiner performed ICP dry etching of the electrode 240 which was exposed from the photoresist 290, for 1 minute by using a mixed gas mainly made of chlorine ($Cl_2$), boron chloride ($BCl_2$) and nitrogen ($N_2$). The dry etching condition was that aluminum (Al) and an aluminum-silicon alloy (AlSi) which contains Al at a molar fraction of not lower than 90% are dry-etched at a rate of 800 nm/minute. After performing dry etching of the electrode 240, the examiner removed the photoresist 290 from the semiconductor device 200.

With regard to each sample, the examiner measured the contact resistance of the electrode 240 before dry etching of the electrode 240 and also measured the contact resistance of the electrode 240 after dry etching of the electrode 240. Subsequently the examiner compared the contact resistances of the electrode 240 of each sample before and after dry etching and calculated an increase rate by dry etching.

The results of the second evaluation test show that formation of the electrode layer L3 mainly made of a material that has a higher melting point than that of aluminum (Al) and reacts with aluminum (Al) at 450° C. or higher temperature, between the electrode layer L2 mainly made of aluminum (Al) and the electrode layer L4 mainly made of palladium (Pd) suppresses an increase in contact resistance by dry etching. In terms of suppressing an increase in contact resistance by dry etching, a ratio A/B of thickness A of the electrode layer L3 to thickness B of the electrode layer L4 is preferably between 0.25 and 4.0, inclusive and is more preferably between 0.33 and 3.3, inclusive. Even in the case that the increase rate of the contact resistance is higher than 1, the electrode having sufficiently low contact resistance after dry etching is evaluated as desired electrode. The electrodes of the samples B4, B7, B9 and B10 having the relatively low increase rate of the contact resistance and the relatively low contact resistance after dry etching are evaluated to have especially desirable structures as the source electrode.

A-6. Advantageous Effects

The first embodiment described above allows for formation of the source electrode 140 that suppresses an increase in contact resistance by dry etching. As a result, this improves the flexibility in the manufacturing process of the semiconductor device 100.

B. Second Embodiment

Figure 16:
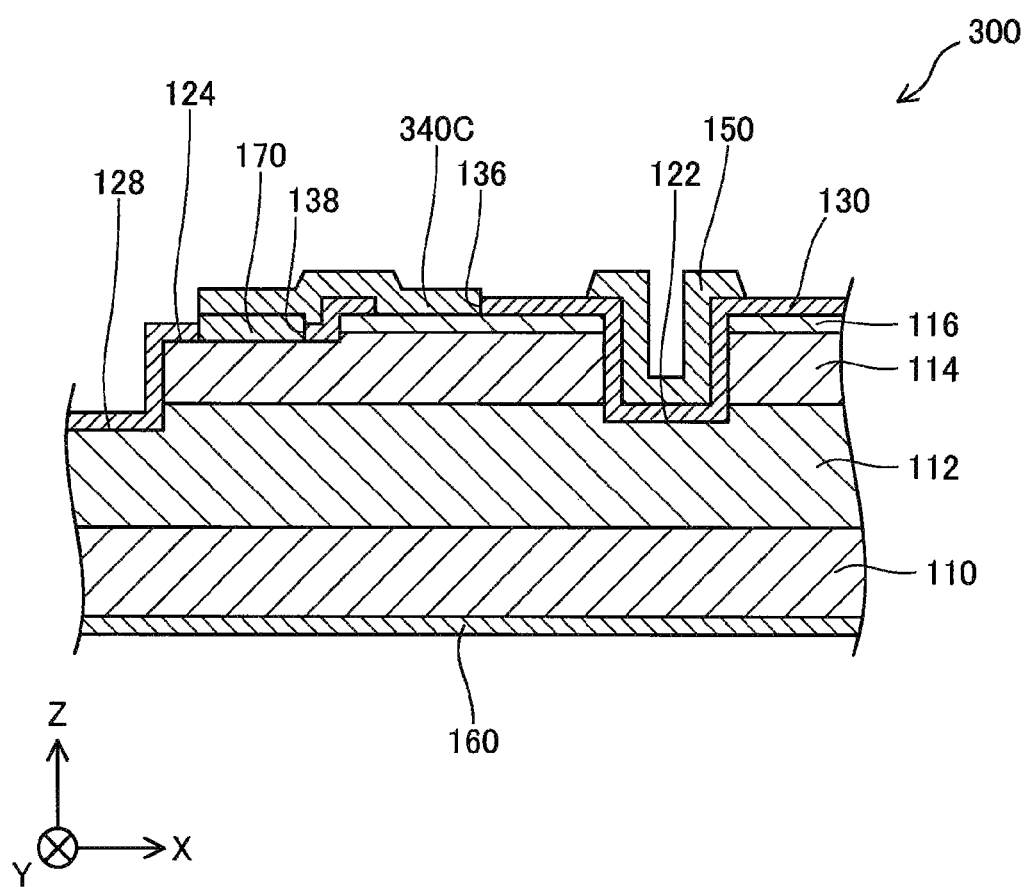
FIG. 16 is a sectional view schematically illustrating the structure of a semiconductor device according to a second embodiment.

FIG. 16 is a sectional view schematically illustrating the structure of a semiconductor device 300 according to a second embodiment. The semiconductor device 300 of the second embodiment is similar to the semiconductor device 100 of the first embodiment, except that the semiconductor device 300 includes a source electrode 340C that is different from the source electrode 140 of the first embodiment. The source electrode 340C of the semiconductor device 300 is similar to the source electrode 140 of the first embodiment, except that the source electrode 340C is formed over from the semiconductor layer 116 in the contact hole 136 to the body electrode 170.

In common with the first embodiment, the second embodiment allows for formation of the source electrode 340C that suppresses an increase in contact resistance by dry etching. As a result, this improves the flexibility in the manufacturing process of the semiconductor device 300. Additionally, the source electrode 340C is formed to cover the body electrode 170. The source electrode 340C accordingly protects the body electrode 170 from dry etching.

C. Other Embodiments

The invention is not limited to any of the embodiments, the examples and the modifications described above but may be implemented by a diversity of other configurations without departing from the scope of the invention. For example, the technical features of any of the embodiments, examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The semiconductor device which the invention is applied to is not limited to the vertical trench MOSFET described in the above embodiment but may be any semiconductor device including an ohmic electrode, for example, a lateral MOS transistor, a junction transistor, a bipolar transistor, an insulating gate bipolar transistor (IGBT) or a thyristor. In the first embodiment, the body electrode 170 may not be formed, and neither the recess 124 nor the contact hole 138 may be formed.

In the embodiment described above, the material of the substrate is not limited to gallium nitride (GaN) but may be, for example, any of silicon (Si), sapphire ($Al_2O_3$) and silicon carbide (SiC). In the embodiment described above, the material of each semiconductor layer is not limited to gallium nitride (GaN) but may be, for example, any of silicon (Si), silicon carbide (SiC), gallium arsenide (GaAs) and indium phosphide (InP).

In the above embodiment, the donor element included in the n-type semiconductor is not limited to silicon (Si) but may be, for example, germanium (Ge) or oxygen (O).

In the above embodiment, the acceptor element included in the p-type semiconductor is not limited to magnesium (Mg) but may be, for example, zinc (Zn) or carbon (C).

In the above embodiment, the material of the insulating film may be any material that has electrical insulating characteristics and may be, for example, at least one selected from the group consisting of silicon nitride (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON), as well as silicon dioxide ($SiO_2$). The insulating film may have a single-layered structure or a two-layered or multi-layered structure. The technique of forming the insulating film is not limited to ALD but may be, for example, ECR sputtering or ECR-CVD.

The electrode layer 141 of the source electrode 140 may be an electrode layer that is mainly made of at least one of titanium (Ti) and vanadium (V).

The material of the electrode layer 141 of the source electrode 140 may be an aluminum alloy which contains aluminum (Al) at a molar fraction of not lower than 90% (for example, aluminum-silicon alloy (AlSi), aluminum-copper alloy (AlCu) or aluminum-silicon-copper alloy (AlSiCu)).

The material of the electrode layer 143 of the source electrode 140 may be any material that has a higher melting point than that of aluminum (Al) and reacts with aluminum (Al) at 450° C. or higher temperature. For example, the material of the electrode layer 143 may be at least one selected from the group consisting of molybdenum (Mo), vanadium (V), titanium (Ti), tantalum (Ta), tungsten (W), niobium (Nb), platinum (Pt), zirconium (Zr) and hafnium (Hf). The electrode layer 143 is not limited to the single-layered structure but may have a multi-layered structure. For example, the electrode layer 143 may include at least one electrode layer selected from the group consisting of an electrode layer mainly made of molybdenum (Mo), an electrode layer mainly made of vanadium (V), an electrode layer mainly made of titanium (Ti), an electrode layer mainly made of tantalum (Ta), an electrode layer mainly made of tungsten (W), an electrode layer mainly made of niobium (Nb), an electrode layer mainly made of platinum (Pt), an electrode layer mainly made of zirconium (Zr) and an electrode layer mainly made of hafnium (Hf).

The material of the gate electrode 150 may be at least one selected from the group consisting of aluminum (Al), an aluminum alloy (for example, aluminum-silicon alloy (AlSi), aluminum-copper alloy (AlCu) or aluminum-silicon-copper alloy (AlSiCu)), titanium (Ti), titanium nitride (TiN) and molybdenum (Mo). The gate electrode 150 is not limited to the single-layered structure but may have a multi-layered structure. For example, the gate electrode 150 may have a two-layered structure of titanium (Ti) and aluminum (Al) stacked sequentially from the insulating film side, a two-layered structure of titanium nitride (TiN) and aluminum (Al) stacked sequentially from the insulating film side, a two-layered structure of molybdenum (Mo) and aluminum (Al) stacked sequentially from the insulating film side or a three-layered structure of titanium nitride (TiN), aluminum (Al) and titanium nitride (TiN) stacked sequentially from the insulating film side.

The drain electrode 160 is not limited to the two-layered structure of titanium (Ti) and aluminum (Al) stacked sequentially from the semiconductor layer side but may have a two-layered structure of vanadium (V) and aluminum (Al) stacked sequentially from the semiconductor layer side, a two-layered structure of titanium (Ti) and an aluminum alloy (for example, aluminum-silicon alloy (AlSi), aluminum-copper alloy (AlCu) or aluminum-silicon-copper alloy (AlSiCu)) stacked sequentially from the semiconductor layer side, or a two-layered structure of vanadium (V) and an aluminum alloy (for example, aluminum-silicon alloy (AlSi), aluminum-copper alloy (AlCu) or aluminum-silicon-copper alloy (AlSiCu)) stacked sequentially from the semiconductor layer side. The drain electrode 160 may have the same structure as that of the source electrode 140.

The material of the body electrode 170 may be at least one selected from the group consisting of palladium (Pd), nickel (Ni), platinum (Pt) and cobalt (Co). The body electrode 170 is not limited to the single-layered structure but may have a multi-layered structure. For example, the body electrode 170 may have a two-layered structure of palladium (Pd) and nickel (Ni) stacked sequentially from the semiconductor layer side or a two-layered structure of palladium (Pd) and platinum (Pt) stacked sequentially from the semiconductor layer side.

What is claimed is:

1. A manufacturing method of a semiconductor device, the manufacturing method comprising:
    a stacking process of forming an electrode by stacking a plurality of electrode layers on a semiconductor layer; and
    a anneal treatment process of annealing the electrode,
    the stacking process including processes of:
        forming a first electrode layer mainly made of aluminum (Al) as one of the plurality of electrode layers;
        forming a second electrode layer mainly made of a conductive material that has a higher melting point than that of aluminum (Al) and reacts with aluminum (Al) at 450° C. or higher temperature, as one of the plurality of electrode layers, on the first electrode layer; and
        forming a third electrode layer mainly made of palladium (Pd) as an electrode layer most distant from the semiconductor layer among the plurality of electrode layers, on the second electrode layer.

2. The manufacturing method according to claim 1, wherein a thickness of the second electrode layer is not less than 10 nm.

3. The manufacturing method according to claim 1, wherein the process of forming the second electrode layer forms at least one of:
    an electrode layer mainly made of molybdenum (Mo);
    an electrode layer mainly made of vanadium (V);
    an electrode layer mainly made of titanium (Ti);
    an electrode layer mainly made of tantalum (Ta);
    an electrode layer mainly made of tungsten (W);
    an electrode layer mainly made of niobium (Nb);
    an electrode layer mainly made of platinum (Pt);
    an electrode layer mainly made of zirconium (Zr); and
    an electrode layer mainly made of hafnium (Hf), as the second electrode layer.

4. The manufacturing method according to claim 1, wherein a thickness of the third electrode layer is not less than 10 nm.

5. The manufacturing method according to claim 1, wherein a ratio A/B of thickness A of the second electrode layer to thickness B of the third electrode layer is between 0.25 and 4.0, inclusive.

6. The manufacturing method according to claim 1, wherein a ratio A/B of thickness A of the second electrode layer to thickness B of the third electrode layer is between 0.33 and 3.3, inclusive.

7. The manufacturing method according to claim 1, wherein the stacking process forms the electrode to surfaces spreading from the semiconductor layer to another electrode formed on the semiconductor layer.

8. The manufacturing method according to claim 1, wherein the stacking process forms the electrode on the semiconductor layer mainly made of gallium nitride (GaN).

9. The manufacturing method according to claim 1, wherein
    the stacking process further includes a process of forming another electrode layer mainly made of at least one of titanium (Ti) and vanadium (V) as one of the plurality of electrode layers on the semiconductor layer, and
    the process of forming the first electrode layer forms the first electrode layer on the another electrode layer.

10. The manufacturing method according to claim 1, wherein the anneal treatment process treats the electrode for a time period between 1 minute and 10 minutes, inclusive.

11. The manufacturing method according to claim 1, wherein the anneal treatment process treats the electrode at a treatment temperature between 450° C. and 700° C., inclusive.

* * * * *